(12) United States Patent
Flickinger et al.

(10) Patent No.: US 6,178,096 B1
(45) Date of Patent: Jan. 23, 2001

(54) SHIELDING COVER HAVING PARTS HELD TOGETHER BY LATCH MEMBERS

(75) Inventors: Steven L. Flickinger, Hummelstown; Lori A. Mayer, Harrisburg; Wilmer L. Sheesley, Halifax; William L. Herb; Thomas G. Schaedler, both of Harrisburg, all of PA (US)

(73) Assignee: The Whitaker Corporation, Wilmington, DE (US)

( * ) Notice: Under 35 U.S.C. 154(b), the term of this patent shall be extended for 0 days.

(21) Appl. No.: 09/199,367

(22) Filed: Nov. 25, 1998

(51) Int. Cl.[7] .................... H05K 9/00; H01R 9/09
(52) U.S. Cl. .................... 361/816; 361/736; 361/759; 361/741; 361/800; 439/76.1; 206/719
(58) Field of Search ....................... 361/728, 736, 361/752, 753, 756, 759, 800, 801, 802, 816, 741, 747; 439/76.1, 610; 206/706, 719; 211/41.17

(56) References Cited

U.S. PATENT DOCUMENTS

| | | |
|---|---|---|
| 5,162,000 | 11/1992 | Frantz ........................ 439/607 |
| 5,217,394 | 6/1993 | Ho ........................... 439/620 |
| 5,342,216 | 8/1994 | Davis et al. ................. 439/362 |
| 5,647,758 | 7/1997 | Ichikawa et al. ............. 439/362 |
| 5,729,431 | 3/1998 | Marwah et al. .............. 361/687 |
| 5,797,771 | * 8/1998 | Garside ...................... 439/610 |
| 5,836,774 | * 11/1998 | Tan et al. .................... 439/76.1 |
| 5,859,766 | 1/1999 | Van Scyoc et al. ............ 361/752 |
| 5,941,725 | * 8/1999 | Brennan et al. .............. 439/357 |

FOREIGN PATENT DOCUMENTS

| | | | |
|---|---|---|---|
| 531 801 | 1/1973 | (CH) | ............. H01R/23/02 |
| 0 668 715 A1 | 8/1995 | (EP) | ............. H05K/7/20 |
| WO 98/34448 | 8/1998 | (WO) | ............. H05K/7/14 |

* cited by examiner

Primary Examiner—Jayprakash N. Gandhi

(57) ABSTRACT

A shielding cover for a GBIC module (30) including a pair of cover parts (38, 40) formed with complementary features to surround a printed circuit board (32) of the module. A pair of latch members (42, 44) hold the two cover parts together and also provide a latching function when a module is inserted into a guide structure (12) mounted to a host board.

8 Claims, 4 Drawing Sheets

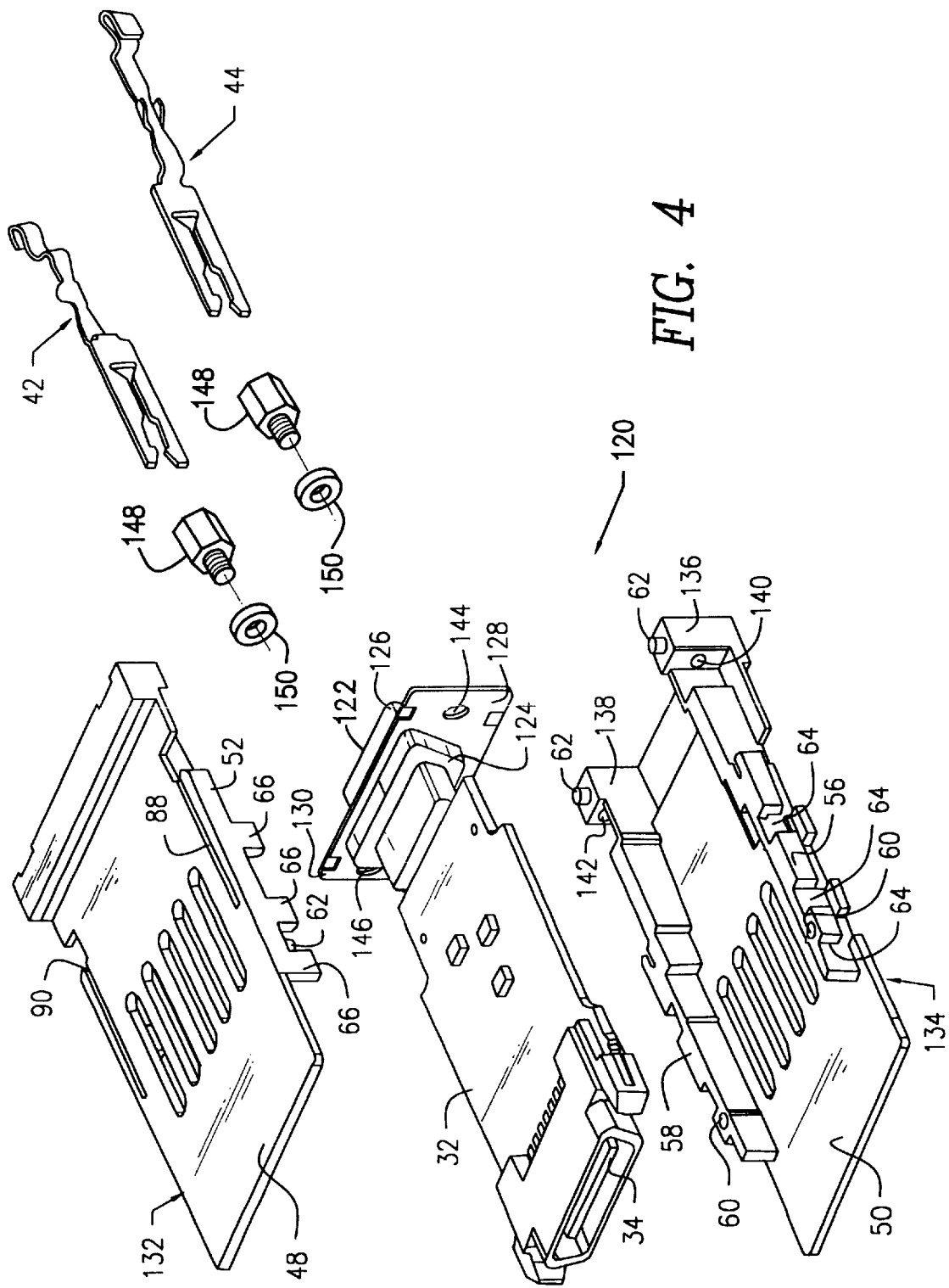

SHIELDING COVER HAVING PARTS HELD TOGETHER BY LATCH MEMBERS

FIELD OF THE INVENTION

This invention relates to a high speed transceiver module and, more particularly, to a shielding cover for such a module.

BACKGROUND OF THE INVENTION

Fibre Channel and Gigabit Ethernet are high speed data transfer interfaces that can be used to interconnect workstations, mainframes, supercomputers and storage devices. Supporting numerous channel and network Upper Level Protocols (ULPs), Fibre Channel allows faster data transfer over longer distances between a larger number of devices or communication points. The standard combines attributes of a channel with attributes of a network, thus providing a general transport vehicle for ULPs such as the Small Computer System Interface (SCSI), the Intelligent Peripheral Interface (IPI), the High Performance Parallel Interface (HIPPI), the Internet Protocol (IP), Ethernet (IEEE 802.3) and the Asynchronous Transfer Mode (ATM). Accommodating the pattern of ever increasing data rates, Fibre Channel is a scalable interconnect standard that considers all aspects of speed, length and media (copper and fiber). Fibre Channel development is focused on data transfer at 1.0625 Gbits/sec with provisions for 2.125 Gbits/sec and 4 Gbits/sec.

AMP Incorporated of Harrisburg, Pa., Compaq Computer Corporation of Houston, Tex., Vixel Corporation of Bothell, Washington and Sun Microsystems Computer Company of Mountain View, Calif. have together agreed on and written a standard for a serial transceiver module, which is called the Gigabit Interface Converter (GBIC) module. The module provides a single small form factor for a wide variety of standard Fibre Channel connectors and transmission media. The module can be inserted in or removed from a host or switch chassis without first removing power from the receiving socket. Any copper and optical transmission technologies consistent with the form factor can be used.

The GBIC module has a plug in a first insulative housing and a receptacle in a second insulative housing at respective opposite ends of the module. A printed circuit board is secured to, and connects, the plug and the receptacle. The module is insertable into a guide structure mounted to a host board and having a receiving end and a terminating end. The terminating end of the guide structure has a receptacle for mating engagement with the module plug when the module is fully inserted in the guide structure. The guide structure houses and aligns the module and provides polarized guide rails to prevent incorrect installation of the module and is designed to accept the side retention latches specified in the GBIC module standard.

Since the GBIC module is designed for high speed data transfer, it would be desirable to provide electromagnetic shielding for the module. Such shielding should effectively cover the module from the plug to the receptacle while still remaining within the form factor of the GBIC module standard.

SUMMARY OF INVENTION

A shielding cover according to the present invention comprises first and second cover parts formed of electrically conductive material. Each of the first and second cover parts has a generally planar major wall parallel to and spaced from the printed circuit board of the module and at least partially covers and extends between the insulative housings of the module plug and receptacle on a respective side of the printed circuit board. Each of the first and second cover parts further includes a pair of opposed side walls orthogonal to the respective major wall and adjacent opposite edges of the printed circuit board. The side walls of the cover parts have features complementary to features of a respective one of the side walls of the other cover part, so that the first and second cover parts can be placed over opposite major surfaces of the printed circuit board and brought together to surround the printed circuit board. Each of the side walls is also formed with a respective ledge which is parallel to and open toward the respective major wall. A pair of latch members are also provided. Each of the latch members cooperates with a respective pair of side walls adjacent a respective edge of the printed circuit board. Each of the latch members has a bifurcated portion adapted to engage a respective opposed ledge on each side wall of the respective pair of side walls to prevent the separation of the first and second cover parts.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 4 is a view similar to FIG. 2 showing a second embodiment of the inventive construction for an alternative type of receptacle secured to the printed circuit board.

DETAILED DESCRIPTION

Figure 1:
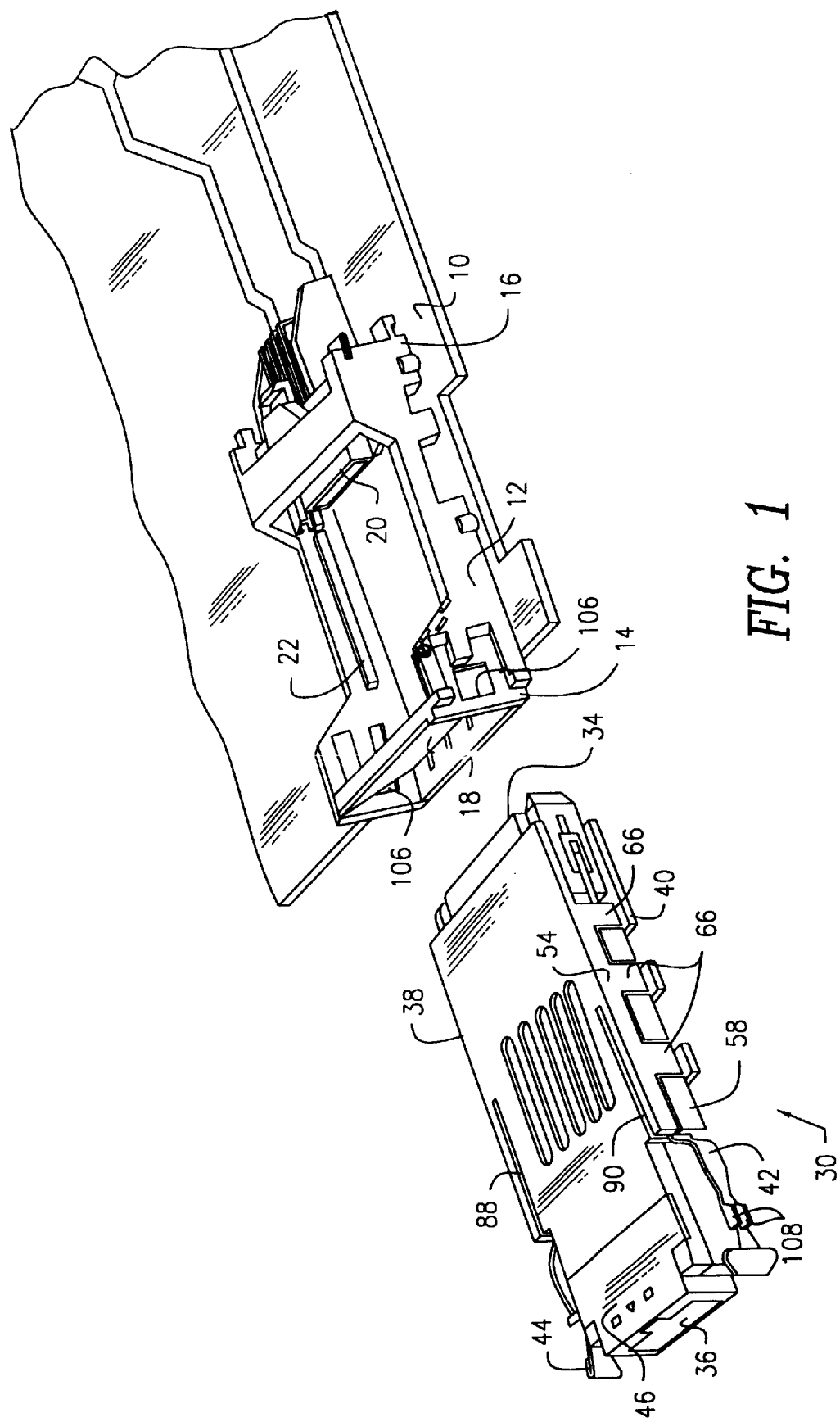
FIG. 1 is a perspective view showing the insertion of a GBIC module constructed according to the present invention into a guide structure mounted to a host board.

Referring now to the drawings, FIG. 1 shows a host printed circuit board 10 on which is mounted guide structure 12 according to the GBIC standard. The guide structure 12 has a receiving end 14 and a terminating end 16. At the receiving end 14, there is provided a spring biased pivoting door 18 which functions as a dust cover and electromagnetic interference shield. A receptacle 20 is provided at the terminating end 16 and is connected to traces on the circuit board 10. Preferably, the guide structure 12 is formed of insulative material and has polarizing features, such as rails 22 on its opposed side walls which cooperate with complementary channels on the GBIC module to allow the module to be inserted into the guide structure 12 only in the proper direction.

As shown, the GBIC module, designated generally by the reference numeral 30, includes a printed circuit board 32 (FIG. 2) which is connected at one end to a plug 34 in a first insulative housing and a receptacle 36 in a second insulative housing. The module plug 34 is adapted for receipt in the guide structure receptacle 20 when the module 30 is fully inserted within the guide structure 12. The printed circuit board 32, the plug 34, and the receptacle 36 are all of standard construction according to the GBIC module standard and are complementary to the guide structure 12 for mating therewith. In the embodiment shown in FIG. 2, the receptacle 36 is of the type known as a high speed serial data connector (HSSDC). Since the module 30 is used in a high speed data transfer environment, an improved electromagnetic shielding arrangement for the module 30 has been developed, as will be described in full detail hereinafter.

Figure 2:
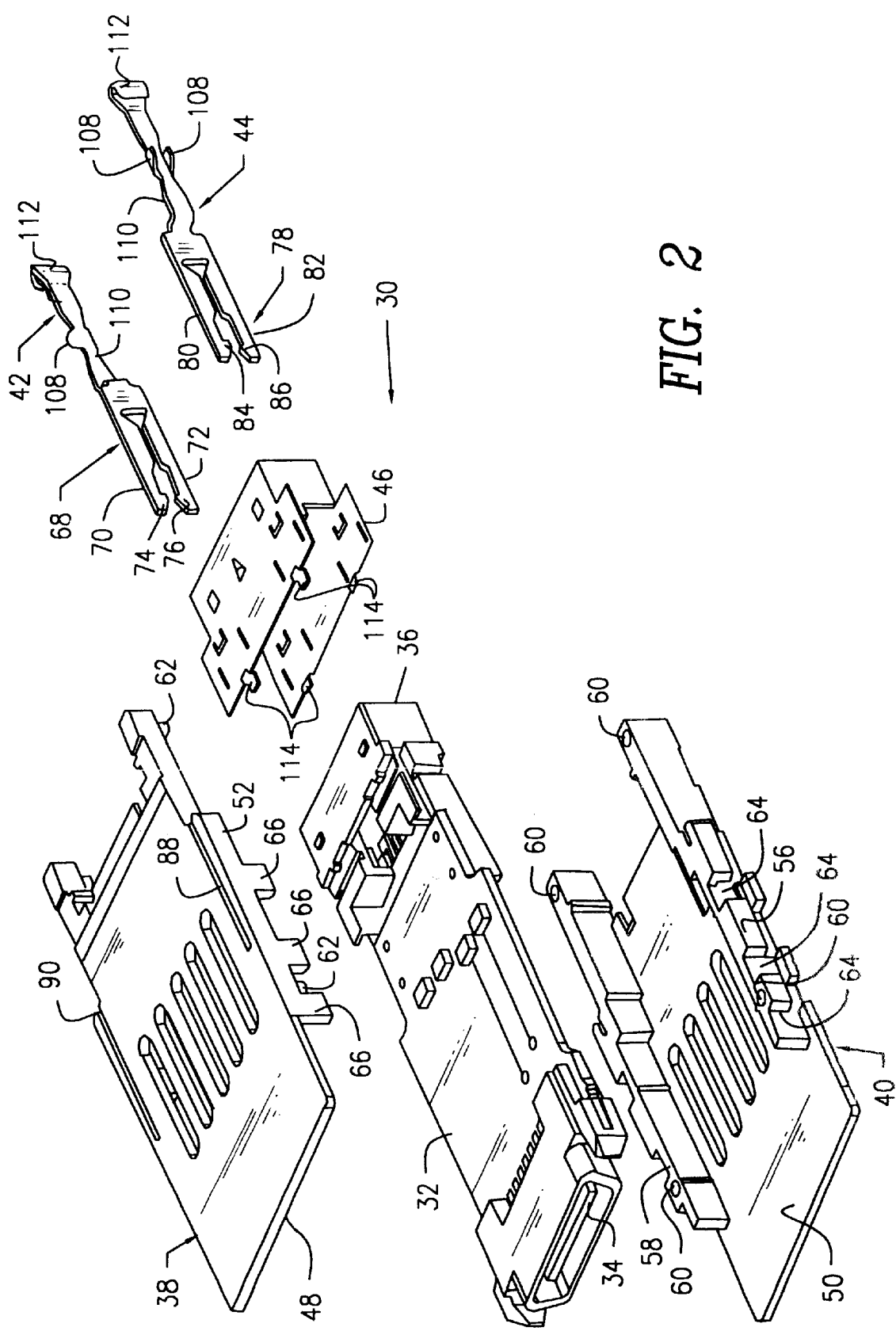
FIG. 2 is an exploded perspective view showing a first embodiment of a GBIC module constructed according to the present invention.

As best shown in FIG. 2, the improved inventive shielding arrangement for the GBIC module 30 includes an upper shield cover part 38, a lower shield cover part 40, a pair of latch members 42, 44, and a shield member 46. All of the parts 38, 40, 42, 44, 46 of the inventive shielding arrangement are formed of electrically conductive material. Illustratively, the shield cover parts 38, 40 are die cast aluminum with nickel plating, whereas the latch members 42, 44 and the shield member 46 are formed from conductive sheet stock material.

It will be noted from FIG. 2 that the printed circuit board 32 is recessed on both edges below the insulative housings of the plug 34 and the receptacle 36. Thus, the upper cover part 38 includes a generally planar major wall 48 which rests on the insulative housings of the plug 34 and receptacle 36 so that it is parallel to, but spaced from, the upper major surface of the printed circuit board 32 and all circuitry thereon. Similarly, the lower cover part 40 has a generally planar major wall 50 which rests on the insulative housings of the plug 34 and the receptacle 36 so that it is parallel to, but spaced from, the lower major surface of the printed circuit board 32 and all of the circuitry thereon. In order to surround the circuitry on the printed circuit board 32, the upper cover part 38 is formed with a pair of opposed side walls 52, 54 which extend orthogonally to the major wall 48 from opposite edges thereof, with each of the side walls 52, 54 being adjacent a respective opposite edge of the printed circuit board 32. Similarly, the lower cover part 40 is formed with a pair of side walls 56, 58 which extend orthogonally to the major wall 50 from opposite edges thereof and are each adjacent a respective opposite edge of the printed circuit board 32. The side walls 52, 56 are formed with complementary features, as are the side walls 54, 58, as will be described, so that the cover parts 38, 40 can be brought together to surround the printed circuit board 32.

Among the complementary features on the cover parts 38, 40 are the holes 60 on the side walls 56, 58 and the pins 62 on the side walls 52, 54. The pins 62 are sized so as to be press fit into the holes 60, thereby functioning to secure the cover parts 38, 40 together, as well as aligning them for assembly. In addition, the side walls 56, 58 are formed with channels 64 and the side walls 52, 54 are formed with legs 66 extending into the channels 64 so that there is at least a partial overlap of each pair of side walls 52, 56 and 54, 58.

Among their other functions, the latch members 42, 44 are effective to hold together the cover parts 38, 40 after they are placed together surrounding the printed circuit board 32. As shown, the latch member 42 has a bifurcated portion 68 including a pair of spaced substantially parallel legs 70, 72 each with a respective barb 74, 76 at its distal end. Similarly, the latch member 44 includes a bifurcated portion 78 having legs 80, 82 each with a respective barb 84, 86. The latch members 42, 44 are left and right types designed for placement on respective sides of the module 30.

Figure 3:
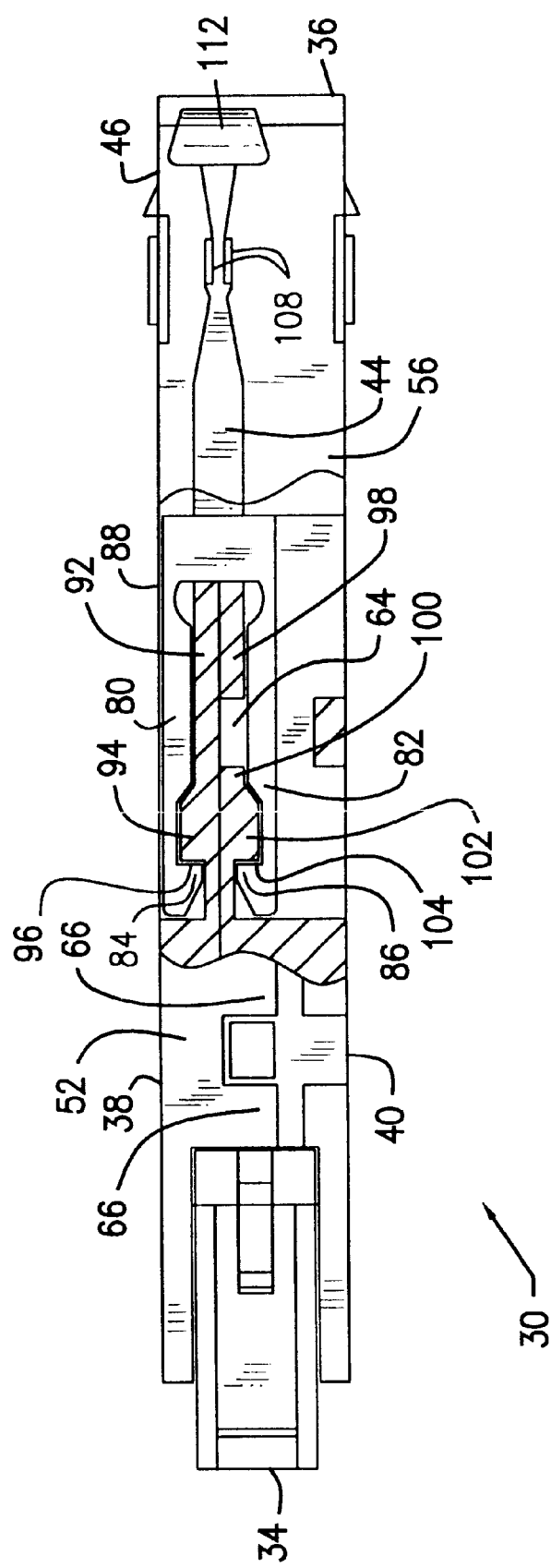
FIG. 3 is a partially cut away side view of the GBIC module shown in FIG. 2 illustrating how a latch member is used to lock in place the two cover parts of the module.

To cooperate with the latch members 42, 44, each of the side walls 52, 54, 56, 58 is formed with a respective ledge parallel to and open toward the respective major wall 48, 50. As will be described, after the cover parts 38, 40 are brought together, the legs of the bifurcated portion of each of the latch members 42, 44 are slid over a respective opposed pair of ledges. Each of the ledges is terminated by an orthogonal distal wall which is engaged by a respective barb so as to interfere with the subsequent removal of the latch member. Thus, the upper cover part 38 is formed with a slot 88 extending into the side wall 52. A similar slot 90 is formed in the side wall 54. The slot 90 is identical to, but the mirror image of, the slot 88 and no further discussion thereof is deemed necessary. As shown in FIG. 3, the bottom of the slot 88 defines a ledge which is defined by wall 92 and ramped projection 94. The wall 92 has a generally flat upper surface parallel to the major wall 48 except for the ramped projection 94 which defines the above-described distal wall 96 at its leftmost end (as viewed in FIG. 3). The ledge for the lower cover part 40 is formed within a slot in the side wall 56 which intersects the channels 64. At its upper end, the slot is terminated by the walls 98, 100 and by the downwardly extending ramped projection 102 having at its leftmost end (as viewed in FIG. 3) the orthogonal distal wall 104 which is engaged by the barb 86. Thus, after the cover parts 38, 40 are brought together, as shown in FIG. 3, the latch member 44 is slid to the left so that its legs 80, 82 are separated by the wall 92 and the walls 98, 100. As the latch member 44 is moved leftwardly, its barbs 84, 86 ride over the ramped projections 94, 102, respectively, slightly separating the barbs 84, 86. As the barbs 84, 86 pass the distal walls 96, 104, they snap toward each other, providing interference against subsequent removal of the latch member 44. The latch member 42 operates identically on the other side of the module 30.

As set forth in the GBIC standard, the guide structure 12 has a side latch retention feature for the module 30. In particular, openings 106 are provided on each side of the guide structure 12. To cooperate with the openings 106, the latch members 42, 44 are formed with laterally extending barbs 108 which engage the walls of the openings 106 when the module 30 is fully inserted in the guide structure 12. These barbs 108 are on a latch portion 110 of the latch member 42, 44. The latch portion 110 is resiliently biased in the direction in which the barbs 108 are pointing. Each of the latch members 42, 44 is further formed with a release portion 112 beyond the latch portions 110. The release portion 112 are adapted to be pressed toward each other when it is desired to release the barbs 108 from engagement with the walls of the openings 106, for removal of the module 30 from the guide structure 12.

In addition to the functions of holding the cover parts 38, 40 together and for latching the module 30 in the guide structure 12, the latch members 42, 44 also provide an additional ground current path to the chassis of the host when the guide structure 12 is provided with metallized guide rails.

The shield member 46 for the module 30 is formed from conductive sheet stock material and is cut and bent so that it covers the insulative housing of the module receptacle 36. The shield member 46 is formed with bent tabs 114 which fit under the planar walls 48, 50 of the cover parts 38, 40, respectively. Thus, when the cover parts 38, 40 are locked in place, the shield member 46 is also locked in place.

Since the module receptacle 36 may vary for different applications, the particular design of the shield member 46 and of the ends of the cover parts 38, 40 adjacent the shield member 46 will vary, but the remaining design for the cover parts 38, 40 and the latch members 42, 44 will remain unchanged, resulting in an economical design.

FIG. 4 illustrates a GBIC module, designated generally by the reference numeral 120, where the module receptacle 122 is of the type known as a subminiature D nine position connector (sometimes called a DB-9 connector) instead of the high speed serial data connector illustrated in FIGS. 1–3. The elements of the module 120 which are identical to corresponding elements of the module 30 (FIGS. 1–3) are identified by the same reference numeral. Thus, for example, the module 120 includes the latch members 42, 44 which function identically to the latch members 42, 44 of the module 30.

The DB-9 connector functioning as the module receptacle 122 includes an insulative housing 124, the mating end of which is enclosed within a conductive shield 126. The shield 126 has a pair of laterally extending flanges 128, 130 conventionally used for mounting and grounding the receptacle 122. Since the receptacle 122 has its own shield, the shield member 46 (FIGS. 1–3), or any equivalent part, may be eliminated from the module 120.

The different receptacle 122 results in modified cover parts 132, 134. These cover parts 132, 134 terminate just short of the flanges 128, 130 and have a portion of their major walls 48, 50 shaped to receive that part of the insulative housing 124 which is adjacent the circuit board 32. At that end of the lower cover part 134, there are provided a pair of blocks 136, 138 which butt up against the rear surfaces of the flanges 128, 130, respectively. Each of the blocks 136, 138 has a respective internally threaded bore 140, 142 aligned with corresponding openings 144, 146 in the flanges 128, 130. Thus, when the module 120 is assembled, the receptacle 122 is firmly secured to the lower cover part 134 by the screws 148 being inserted through the openings 144, 146 and then being threaded into the bores 140, 142. If desired, washers 150 may be installed between the screws 148 and the flanges 128, 130.

Accordingly, there has been disclosed an improved shielding cover for a GBIC module. While illustrative constructions for the inventive cover have been disclosed herein, it will be understood that various modifications and adaptations to the disclosed constructions will be apparent to one of ordinary skill in the art and it is therefore intended that this invention be limited only by the scope of the appended claims.

What is claimed is:

1. A shielding cover for a transceiver module, the transceiver module having a plug in a first insulative housing and a receptacle in a second insulative housing at respective opposite ends of the module, and a printed circuit board secured to and connecting the plug and the receptacle, the transceiver module being insertable into a guide structure having a receiving end and a terminating end, the guide structure terminating end having a receptacle for mating engagement with the plug when the transceiver module is fully inserted in the guide structure, the shielding cover comprising:

first and second cover parts formed of electrically conductive material, each of said first and second cover parts having a generally planar major wall extending parallel to and spaced from a respective major surface of said printed circuit board and at least partially covering and extending between said first and second insulative housings, wherein each of said first and second cover parts further includes a pair of side walls extending orthogonal to the respective major wall and adjacent to respective opposite edges of the printed circuit board, each of the side walls of the first cover part being complementary to one of the side walls of the second cover part so that said first and second cover parts can be placed over the respective major surfaces of said printed circuit board and brought together to surround said printed circuit board, and each of said side walls having a respective ledge that is recessed within a slot that is open toward the respective major wall; and a pair of latch members each cooperating with a respective pair of said complementary side walls of said first and second cover parts, each of said latch members having a bifurcated portion that engages said ledges of said complementary side walls to prevent separation of said first and second cover parts.

2. The cover according to claim 1 further comprising:

a shield member secured to said first and second cover parts and covering the module second insulative housing.

3. The cover according to claim 1 wherein said guide structure includes a first latch feature adjacent said receiving end, and each of said latch members further includes:

a latch portion extending from said bifurcated portion toward said module receptacle, said latch portion being biased away from said respective pair of side walls and including a second latch feature which is complementary to said first latch feature; and a release portion extending beyond said latch portion and adapted for manual manipulation to move said latch portion toward said respective pair of side walls to release said second latch feature from said first latch feature.

4. The cover according to claim 3 wherein said first latch feature includes an opening in said guide structure and said second latch feature includes at least one barb insertable in said opening.

5. The cover according to claim 1 wherein:

each said ledge is terminated by a distal wall orthogonal to said ledge; and the bifurcated portion of each said latch member has a spaced pair of legs each formed with a barb at its distal end facing the other leg for engaging the distal wall of a respective said ledge;

wherein the bifurcated portion of each said latch member can be slid over a respective pair of said ledges until the barbs on each of the legs snap over the respective distal walls.

6. A shielding cover for a transceiver module that is receivable in a guide structure, the transceiver module including a circuit board, the shielding cover comprising:

first and second cover parts which are disposed over respective opposite major surfaces of the circuit board; and a pair of latch members connected to the first and the second cover parts, the pair of latch members being operable for releasably securing the transceiver module in the guide structure, each of the latch members having a bifurcated portion that engages a respective pair of ledges on respective ones of the first and the second cover parts, wherein the bifurcated portions of the latch members prevent separation of the first and the second cover parts.

7. The shielding cover according to claim 6, wherein each of the ledges is recessed within a slot in a respective one of the first and the second cover parts.

8. The shielding cover according to claim 7, wherein each of the first and the second cover parts includes a major wall extending parallel to one of the major surfaces of the circuit board, and a pair of side walls extending orthogonal to the major wall, and each of the slots is defined in one of the side walls.

* * * * *